United States Patent
Cooper et al.

(10) Patent No.: US 10,100,405 B2
(45) Date of Patent: Oct. 16, 2018

(54) CVD COATED CUTTING INSERT AND METHOD OF MAKING THE SAME

(71) Applicant: Kennametal Inc., Latrobe, PA (US)

(72) Inventors: Rodrigo A. Cooper, Latrobe, PA (US); Zhenyu Liu, Greensburg, PA (US); Peter R. Leicht, Latrobe, PA (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 108 days.

(21) Appl. No.: 14/690,631

(22) Filed: Apr. 20, 2015

(65) Prior Publication Data
US 2016/0305018 A1    Oct. 20, 2016

(51) Int. Cl.
| | |
|---|---|
| *C23C 16/40* | (2006.01) |
| *C23C 16/44* | (2006.01) |
| *C23C 16/34* | (2006.01) |
| *C23C 16/30* | (2006.01) |
| *C23C 16/36* | (2006.01) |
| *C23C 28/04* | (2006.01) |
| *C23C 28/00* | (2006.01) |
| *C23C 30/00* | (2006.01) |

(52) U.S. Cl.
CPC ............ *C23C 16/403* (2013.01); *C23C 16/30* (2013.01); *C23C 16/34* (2013.01); *C23C 16/36* (2013.01); *C23C 16/44* (2013.01); *C23C 28/042* (2013.01); *C23C 28/044* (2013.01); *C23C 28/42* (2013.01); *C23C 30/005* (2013.01)

(58) Field of Classification Search
USPC .......... 51/307, 309; 428/216, 336, 698, 601, 428/702, 7, 701
See application file for complete search history.

(56) References Cited

U.S. PATENT DOCUMENTS

| | | | |
|---|---|---|---|
| 5,700,569 A | * | 12/1997 | Ruppi .................... C23C 16/32 51/307 |
| 5,709,907 A | | 1/1998 | Battaglia et al. |
| 5,722,803 A | | 3/1998 | Battaglia et al. |
| 6,161,990 A | | 12/2000 | Oles et al. |

(Continued)

FOREIGN PATENT DOCUMENTS

| | | |
|---|---|---|
| EP | 1 455 003 A2 | 9/2004 |
| EP | 1 245 698 B1 | 9/2006 |

(Continued)

OTHER PUBLICATIONS

Chinchanikar et al., "Wear behaviors of single-layer and multi-layer coated carbide inserts in high speed machining of hardened AISI 4340 steel", Journal of Mechanical Science and Technology 27 (5) (2013) pp. 1451-1459.

(Continued)

*Primary Examiner* — Archene A Turner
(74) *Attorney, Agent, or Firm* — Larry Meenan

(57) ABSTRACT

A coated cutting insert for a chipforming material removal operation wherein the coated insert has a substrate and a coating scheme on the substrate. The coating scheme includes a CVD transition coating layer. The coating scheme further includes a CVD multi-layered coating scheme having a plurality of coating sets. Each one of the coating sets has an aluminum oxide coating layer and a nitrogen-containing coating layer.

16 Claims, 8 Drawing Sheets

(56) References Cited

U.S. PATENT DOCUMENTS

| | | | |
|---|---|---|---|
| 6,287,682 B1 * | 9/2001 | Grab | B23B 27/145 |
| | | | 51/307 |
| 6,333,099 B1 * | 12/2001 | Strondl | C23C 28/042 |
| | | | 428/698 |
| 6,720,095 B2 * | 4/2004 | Ruppi | C23C 30/005 |
| | | | 428/702 |
| 6,805,944 B2 * | 10/2004 | Oshika | C23C 30/005 |
| | | | 51/307 |
| 7,132,153 B2 | 11/2006 | Zackisson et al. | |
| 7,153,562 B2 * | 12/2006 | Rodmar | B23B 27/145 |
| | | | 428/216 |
| 7,396,371 B2 | 7/2008 | Cedergren et al. | |
| 7,416,778 B2 * | 8/2008 | Westergren | B23B 27/148 |
| | | | 428/701 |
| 7,455,918 B2 | 11/2008 | Gates, Jr. et al. | |
| 7,470,296 B2 | 12/2008 | Lindholm et al. | |
| 7,597,951 B2 | 10/2009 | Bjormander et al. | |
| 7,727,592 B2 | 6/2010 | Cedergren et al. | |
| 7,785,665 B2 | 8/2010 | Gates, Jr. et al. | |
| 7,887,935 B2 * | 2/2011 | Elkouby | C23C 16/0272 |
| | | | 428/698 |
| 8,080,312 B2 | 12/2011 | McNerny et al. | |
| 8,080,323 B2 | 12/2011 | Ban et al. | |
| 8,323,783 B2 | 12/2012 | Sottke et al. | |
| 8,557,406 B2 | 10/2013 | Ban et al. | |
| 8,801,816 B2 * | 8/2014 | Okuno | C22C 14/00 |
| | | | 51/309 |
| 2008/0050614 A1 * | 2/2008 | Holzschuh | C23C 30/005 |
| | | | 428/698 |
| 2012/0202032 A1 | 8/2012 | Tatsuoka et al. | |
| 2013/0045057 A1 | 2/2013 | Kojima et al. | |

FOREIGN PATENT DOCUMENTS

| | | | |
|---|---|---|---|
| EP | 1 980 649 B1 | | 8/2010 |
| GB | 2048960 | * | 12/1980 |
| JP | 58-006969 | * | 1/1983 |
| WO | 99/29920 | * | 6/1999 |
| WO | 02/077312 A2 | | 10/2002 |

OTHER PUBLICATIONS

Halvarsson et al., Microstructure and performance of CVD κ-Al2O3 multilayers, Materials Science and Engineering A209 (1996)pp. 337-344.

Moltrecht, vol. 1 Machine Shop Practice, Second Edition, Industrial Press Inc. New York, New York (1981) pp. 199-204.

ASTE Tool Engineers Handbook, McGraw-Hill Book Company, Inc. New York, New York (1949) pp. 302-315.

* cited by examiner

CVD COATED CUTTING INSERT AND METHOD OF MAKING THE SAME

BACKGROUND OF THE INVENTION

The present invention pertains to a coated cutting insert, and especially a coated cutting insert coated via a chemical vapor deposition (CVD) technique, and which is useful in chipforming material removal applications such as, for example, machining, turning, and milling, as well as a method of making the same. More specifically, the present invention pertains to a CVD-coated cutting insert comprising a substrate with a coating scheme thereon and wherein the coating scheme includes a plurality of coating layers including a multi-layered coating scheme comprising a plurality of repeating coating sets. Each coating set comprises a coating layer of aluminum oxide and a coating layer of a nitrogen-containing material (e.g., titanium aluminum oxynitride or titanium nitride or zirconium nitride) whereby the coating scheme, which is applied by CVD, has higher toughness, good crack resistance, acceptable adhesion properties, acceptable abrasive wear resistance properties, and acceptable edge integrity, as well as a method of making the coated cutting insert.

Heretofore, coated bodies, such as, for example, coated cutting inserts, have been used in chipforming material removal applications. Such coated cutting inserts typically comprise a substrate of a cutting insert geometry and a coating scheme on the substrate. The coating layers that comprise the coating scheme typically comprise hard refractory materials that exhibit the property of wear resistance. One primary purpose of using a coating on a cutting insert has been to lengthen the useful life of the cutting insert in the material removal application. Exemplary ones of these coating schemes using hard refractory materials are described in the following documents: European Patent Application 1 245 698 B1 to Mitsubishi Materials Corp., European Patent Application No. 1 455 003 A2 to Sandvik A B, European Patent Application No. 1 980 649 B1 to Iscar Ltd., United States Published Patent Application No. US2012/0202032 to Tatsuoka et al., United States Published Patent Application No. US2013/0045057 to Kojima et al., U.S. Pat. No. 7,132,153 to Zackisson et al., U.S. Pat. No. 7,396,371 to Cedergren et al., U.S. Pat. No. 7,455,918 to Gates, Jr. et al., U.S. Pat. No. 7,470,296 to Londholm et al., U.S. Pat. No. 7,597,951 to Bjormander et al., U.S. Pat. No. 7,727,592 to Cedergren et al., U.S. Pat. No. 7,785,665 to Gates, Jr., et al., U.S. Pat. No. 8,080,312 to McNerny et al., U.S. Pat. No. 8,080,323 to Ban et al., U.S. Pat. No. 8,323,783 to Sottke et al., U.S. Pat. No. 8,557,406 to Ban et al., Chinchanikar et al., "Wear behavior of single-layer and multi-layer coated carbide inserts in high speed machining of hardened AISI 4340 steel", *Journal of Mechanical Science and Technology*, 27 (5), (2013), pp. 1451-1459, and Halvarsson et al., "Microstructure and performance of CVD κ-$Al_2O_3$ multilayers", *Materials Science and Engineering*, A209 (1996) pp. 337-344.

As is apparent from the above documents, many different coating schemes for a coated cutting insert have been used in the past. According to these documents, each one of these coating schemes is supposed to provide certain advantages. Even though there have been coating schemes that are supposed to provide certain advantages, there remains a need to provide coating scheme that lengthen the useful life of a coated cutting insert, as well as to improve the performance characteristics of a coated cutting insert in a material removal application. Further, there remains a need to provide an improved coated cutting insert wherein the coating scheme has a high toughness resulting in better edge integrity, especially during heavily interrupted turning and milling operations. Still further there remains a need to provide an improved coated cutting insert that has a coating scheme which includes a multi-layered coating scheme that better inhibits crack growth and propagation in the coating scheme whether due to mechanical stresses or thermal cycling. Yet further, there remains a need to provide an improved coated cutting insert that includes a transition coating layer that functions to promote better nucleation and adhesion of the multi-layered coating scheme.

Therefore, it would highly desirable to provide an improved coated cutting insert, and a method of making the same, wherein the cutting insert is useful in material removal applications. It would be highly desirable to provide an improved coated cutting insert, and a method of making the same, wherein the cutting insert is useful in material removal applications wherein the coated cutting insert exhibits a lengthened tool life. It would be highly desirable to provide an improved coated cutting insert, and a method of making the same, wherein the cutting insert is useful in material removal applications wherein the coated cutting insert exhibits improved performance characteristics.

It would be highly desirable to provide an improved coated cutting insert, and a method of making the same, wherein the cutting insert is useful in material removal applications wherein the coated cutting insert has a coating scheme with a high toughness resulting in better edge integrity, especially during heavily interrupted turning and milling operations. It would be highly desirable to provide an improved coated cutting insert, and a method of making the same, wherein the cutting insert is useful in material removal applications wherein the coated cutting insert has a coating scheme which includes a multi-layered coating scheme that better inhibits crack growth and propagation in the coating scheme whether due to mechanical stresses or thermal cycling. It would be highly desirable to provide an improved coated cutting insert, and a method of making the same, wherein the cutting insert is useful in material removal applications wherein the coated cutting insert has a coating that includes a transition coating layer that functions to promote better nucleation and adhesion of the multi-layered coating scheme.

SUMMARY OF THE INVENTION

In one form thereof, the invention is a coated cutting insert for use in a chipforming material removal operation. The coated cutting insert comprises a substrate and a coating scheme on the substrate. The coating scheme comprises a backing coating scheme deposited by chemical vapor deposition wherein the backing coating scheme is on the surface of the substrate. A transition coating layer is deposited by chemical vapor deposition on the surface of the backing coating scheme. A multi-layered coating scheme, which comprises a plurality of coating sets, is deposited by chemical vapor deposition on the surface of the transition coating layer. Each of the coating sets comprises an aluminum oxide coating layer that has an alpha aluminum oxide crystal structure, and a nitrogen-containing coating layer that has a nitrogen-containing coating crystal structure. The aluminum oxide crystal structure is distinct from the nitrogen-containing coating layer crystal structure whereby a distinct boundary is between adjacent aluminum oxide coating layers and the nitrogen-containing coating layers.

In still another form thereof the invention is a method of making a coated cutting insert comprising the steps of: providing a substrate; applying a transition coating layer by chemical vapor deposition; applying a multi-layered coating scheme to the transition coating layer by chemical vapor deposition wherein the multi-layered coating scheme comprises a plurality of coating sets, and wherein the steps to apply each coating set comprise: first applying an aluminum oxide coating layer without variation in coating deposition parameters wherein the aluminum oxide coating layer has an alpha aluminum oxide crystal structure; and interrupting the application of the aluminum oxide coating layer by applying a nitrogen-containing coating layer having a nitrogen-containing coating layer crystal structure wherein the nitrogen-containing coating layer crystal structure is distinct from the alpha aluminum oxide crystal structure thereby forming a distinct boundary between the aluminum oxide coating layer and the nitrogen-containing coating layer.

BRIEF DESCRIPTION OF THE DRAWINGS

The following is a brief description of the drawings that form a part of this patent application.

DETAILED DESCRIPTION OF THE INVENTION

The present invention pertains to a coated cutting insert useful for a chipforming material removal operation. In a chipforming material removal operation, the cutting insert engages a workpiece to remove material from a workpiece typically in the form of chips. A material removal operation that removes material from the workpiece in the form of chips typically is known by those skilled in the art as a chipforming material removal operation. The book *Machine Shop Practice* [Industrial Press Inc., New York, N.Y. (1981)] by Moltrecht presents at pages 199-204 a description, inter alia, of chip formation, as well as different kinds of chips (i.e., continuous chip, discontinuous chip, segmental chip). Moltrecht reads [in part] at pages 199-200, "When the cutting tool first makes contact with the metal, it compresses the metal ahead of the cutting edge. As the tool advances, the metal ahead of the cutting edge is stressed to the point where it will shear internally, causing the grains of the metal to deform and to flow plastically along a plane called the shear plane . . . . When the type of metal being cut is ductile, such as steel, the chip will come off in a continuous ribbon . . . ". Moltrecht goes on to describe formation of a discontinuous chip and a segmented chip.

As another example, the text found at pages 302-315 of the *ASTE Tool Engineers Handbook*, McGraw Hill Book Co., New York, N.Y. (1949) provides a lengthy description of chip formation in the metal cutting process. At page 303, the ASTE Handbook makes the clear connection between chip formation and machining operations such as turning, milling and drilling. The following patent documents discuss the formation of chips in a material removal operation: U.S. Pat. No. 5,709,907 to Battaglia et al. (assigned to Kennametal Inc.), U.S. Pat. No. 5,722,803 to Battaglia et al. (assigned to Kennametal Inc.), and U.S. Pat. No. 6,161,990 to Oles et al. (assigned to Kennametal Inc.).

Figure 1:
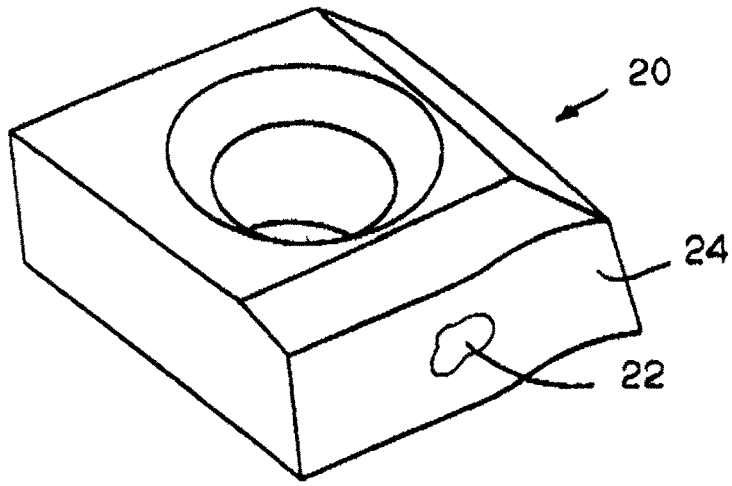
FIG. 1 is an isometric view of a coated cutting insert that has a coating scheme applied to a substrate wherein a portion of the coating scheme has been removed to show the substrate.

Referring to the drawings, there are shown a number of specific embodiments of a coated cutting insert. Referring to FIG. 1, there is illustrated a coated cutting insert generally designated as 20 wherein the coated cutting insert 20 has a substrate 22 and a coating scheme 24 on the substrate 22. The coated cutting insert 20 illustrates a typical kind of geometry used as a coated cutting insert. Each one of these specific embodiments of the coating schemes are discussed in more detail hereinafter.

Figure 2:
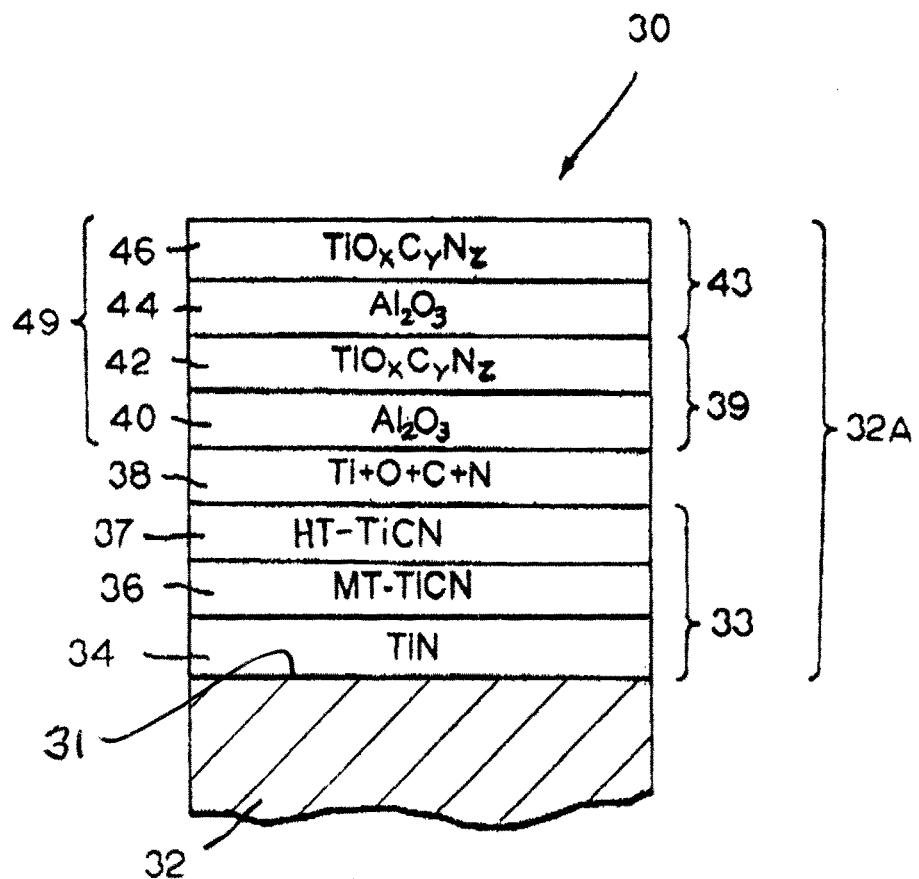
FIG. 2 is a cross-sectional view of a first specific embodiment of a coated cutting insert that shows in a schematic form the substrate and the coating layers that comprise the coating scheme.

Referring to the coating scheme shown in FIG. 2, there is a coated cutting insert generally designated as 30 that comprises a substrate 32 and a coating scheme 32A that is on the surface 31 of the substrate 32. Coating scheme 32A comprises a backing coating scheme 33 that comprises a TiN coating layer 34 on the surface of the substrate 32 and a MT-TiCN coating layer 36 on the TiN coating layer 34 and a TiCN coating layer 37 on the MT-TiCN coating layer 36. The term "MT-TiCN coating layer" refers to a coating layer of titanium carbonitride deposited by chemical vapor deposition (CVD) at a moderate temperature, which ranges between about 750° C. and about 920° C. In contrast to the MT-TiCN coating layer, the term "HT-TiCN" or "TiCN" coating layer refers to a coating layer of titanium carbonitride deposited by CVD at a temperature greater than about 950° C., and typically within a range of between about 950° C. and about 1020° C.

There is a Ti+O+C+N transition coating layer 38 containing titanium and oxygen and carbon and nitrogen on the HT-TiCN coating layer 37. It is important to keep in mind that while applicants do not intend to be bound by any specific theory with respect to the function of the Ti+O+C+N transition coating layer, it is thought that the Ti+O+C+N transition coating layer functions to promote the nucleation and adherence of the coating layers of the multi-layered coating scheme.

The multi-layered coating scheme 49 is on the Ti+O+C+N transition coating layer 38 wherein the multi-layered coating scheme 49 comprises a plurality of coating sets (39, 43). Although FIG. 2 illustrates two coating sets, there should be an appreciation that other numbers of coating sets can be used for this specific embodiment and the other specific embodiments herein. For example, between two and sixteen coating sets, which equates to between four and thirty-two coating layers, are suitable for use in this specific embodiment and the other specific embodiments herein. Coating set 39 comprises an aluminum oxide coating layer 40 and a $TiO_xC_yN_z$ coating layer 42. Coating set 43 comprises an aluminum oxide coating layer 44 and a $TiO_xC_yN_z$ coating layer 46. The aluminum oxide coating layers for this specific embodiment, as well as all of the embodiments herein, is the alpha crystalline phase of aluminum oxide. In reference to the $TiO_xC_yN_z$ coating layers 42 and 46, the values of x, y and z are as follows: $0<x<0.7$, $0<y<0.7$, $0<z<0.7$.

The composition of the coating layers that comprise the coating sets of the multi-layered coating scheme are selected so that the deposition of each coating layer is abruptly interrupted by the deposition of the following coating layer. The result is the complete interruption of the crystalline growth of the previous coating layer by the initiation of the following coating layer. This abrupt interruption can be caused by a change in coating composition or coating parameters resulting in the nucleation of a layer of distinct crystal structure. Such a change can result in different crystal structures between adjacent coating layers. These interruptions result in coating layers in which there is a distinct boundary between the adjacent coating layers so that there are no mixed phases of a composite within each coating layer.

Although not shown in FIG. 2, an alternate embodiment of the invention contains an outer coating layer scheme that can be applied via CVD to the surface of the outermost repeating layer set. Such an outer coating layer may comprise a carbide, carbonitride, nitride, or oxycarbonitride formed of an element from group IVb.

Table 1 below sets forth the ranges of the thicknesses of the coating schemes and coating layers for the coated cutting insert 30 illustrated in FIG. 2.

TABLE 1

Thicknesses for Coating Schemes and Coating Layers of FIG. 2

| Coating Layer or Coating Scheme | Range of Thickness (micrometers) | Alternative Range of Thickness (micrometers) |
| --- | --- | --- |
| coating scheme 32A | 2-35 | 5-30 |
| backing coating scheme 33 | 1-20 | 2-18 |
| TiN coating layer 34 | up to 2 | up to 1 |
| MT-TiCN coating layer 36 | 1-18 | 2-15 |
| HT-TiCN coating layer 37 | Up to 5 | Up to 2 |
| Ti + O + C + N transition coating layer 38 | Up to 3 | Up to 2 |
| Multi-layered coating scheme 49 | 1-15 | 2-12 |
| Coating sets 39 and 43 | 0.1-0.8 | 0.2-0.7 |
| Aluminum oxide coating layers 40 and 44; | 0.05-0.7 | 0.1-0.5 |
| TiOxCyNz coating layers 42 and 46 | 0.01-0.5 | 0.05-0.25 |

Table 2 below sets forth the deposition parameters for the deposition of the coating scheme 32A of the coated cutting insert 30 of FIG. 2

TABLE 2

Process to Produce the Coating Scheme of FIG. 2

| | | Backing TiN | Backing MT-TiCN | Backing HT-TiCN | Transition Ti + O + C + N | Repeat sequence for Multi-Layered Coating Scheme | |
| --- | --- | --- | --- | --- | --- | --- | --- |
| | | | | | | $Al_2O_3$ | TiOxCyNz |
| Temp Range | (° C.) | 850-960 | 750-900 | 950-1020 | 950-1020 | 920-1020 | 950-1050 |
| Press Range | (mb) | 60-90 | 40-90 | 300-700 | 100-400 | 50-120 | 200-500 |
| Duration | Minutes | 10-90 | 50-400 | 5-60 | 30-70 | 5-30 | 3-15 |
| $H_2$ | vol % | balance | balance | Balance | balance | balance | balance |
| $N_2$ | vol % | 15-20 | 25-35 | 20-40 | 15-20 | | 30-45 |
| $CH_4$ | vol % | | | 1-5 | 2-3 | | 2-3 |
| $CO_2$ | vol % | | | | | 2.0-2.8 | |
| HCl | vol % | | 1.0-1.5 | | | 2.5-3.5 | .8-1.5 |
| $H_2S$ | vol % | | | | | 0.1-1.0 | |
| $TiCl_4$ | vol % | 0.5-2.5 | 1.0-2.0 | 1-3 | 0.5-1.3 | | 0.5-1.2 |
| $CH_3CN$ | vol % | | 0.001-0.03 | | | | |
| $AlCl_3$ | vol % | | | | | 4.0-6.0 | |
| CO | vol % | | | | 1.0-1.5 | | 0.8-1.5 |

Figure 3:
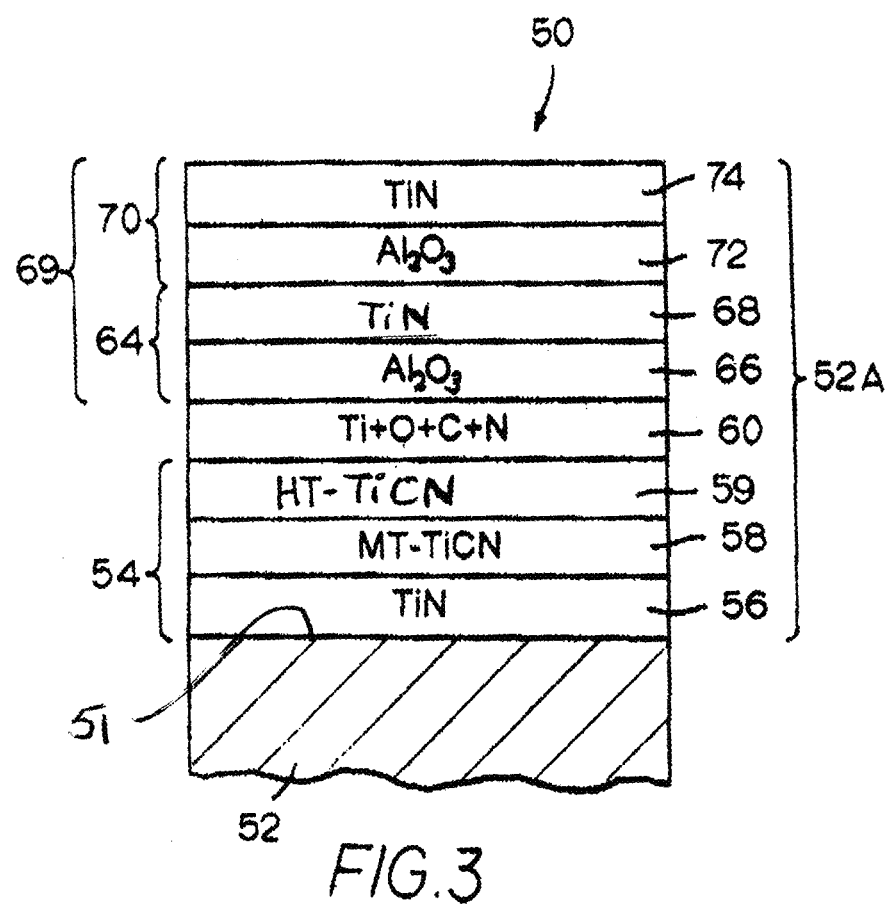
FIG. 3 is a cross-sectional view of a second specific embodiment of a coating scheme of a coated cutting insert that shows in schematic form the substrate and the coating layers that comprise the coating scheme.

Referring to the coating scheme shown in FIG. 3, there is a coated cutting insert generally designated as 50 that comprises a substrate 52 and a coating scheme 52A that is on the surface 51 of the substrate 52. Coating scheme 52A comprises a backing coating scheme 54 that comprises a TiN coating layer 56 on the surface of the substrate 52 and a MT-TiCN coating layer 58 on the TiN coating layer 56 and a HT-TiCN coating layer 59 on the MT-TiCN coating layer 58.

There is a Ti+O+C+N transition coating layer 60 containing titanium and oxygen and carbon and nitrogen on the TiCN coating layer 59. It is important to keep in mind that while applicants do not intend to be bound by any specific theory with respect to the function of the Ti+O+C+N transition coating layer, it is thought that the Ti+O+C+N transition coating layer functions to promote the nucleation and adherence of the coating layers of the multi-layered coating scheme.

The multi-layered coating scheme 69 is on the Ti+O+C+N transition coating layer 60 wherein the multi-layered coating scheme 69 comprises a plurality of coating sets (64, 70).

Coating set 64 comprises an aluminum oxide coating layer 66 and a TiN coating layer 68, and coating set 70 comprises an aluminum oxide coating layer 72 and a TiN coating layer 74. Although not shown in FIG. 3, an alternate embodiment of the invention contains an outer coating layer scheme that can be applied via CVD to the surface of the outermost layer of the repeating set. Such an outer coating layer may comprise a carbide, carbonitride, nitride, or oxycarbonitride formed of an element from group IVb Table 3 below sets forth the ranges of the thicknesses of the coating schemes and coating layers for the coated cutting insert 30 illustrated in FIG. 3.

TABLE 3

Thicknesses for Coating Schemes and Coating Layers of FIG. 3

| Coating Layer or Coating Scheme | Range of Thickness (micrometers) | Alternative Range of Thickness (micrometers) |
|---|---|---|
| Coating scheme 52A | 2-35 | 5-30 |
| Backing coating scheme 54 | 1-20 | 2-18 |
| TiN coating layer 56 | Up to 2 | Up to 1 |
| MT-TiCN coating layer 58 | 1-18 | 2-15 |
| HT-TiCN coating layer 59 | Up to 5 | Up to 2 |
| Ti + O + C + N transition coating layer | Up to 3 | Up to 2 |
| Multi-layered coating scheme 69 | 1-15 | 2-12 |
| Coating sets 64 and 70 | 0.1-0.8 | 0.2-0.7 |
| Aluminum oxide coating layers 66 and 72 | 0.05-0.7 | 0.1-0.5 |
| TiN coating layers 68 and 74 | 0.01-0.5 | 0.05-0.25 |

Table 4 below sets forth the deposition parameters for the deposition of the coating scheme 52A of the coated cutting insert 50 of FIG. 3

TABLE 4

Process to Produce the Coating Scheme of FIG. 3

| | | Backing | Backing | Backing | Transition | Repeat sequence for Multi-Layered Coating Scheme | |
|---|---|---|---|---|---|---|---|
| | | TiN | MT-TiCN | HT-TiCN | Ti + O + C + N | $Al_2O_3$ | TiN |
| Temp Range | (° C.) | 850-960 | 750-900 | 950-1020 | 950-1020 | 920-1020 | 950-1050 |
| Press Range | (mb) | 60-90 | 40-90 | 300-700 | 100-400 | 50-120 | 60-250 |
| Duration | Minutes | 10-90 | 50-400 | 5-60 | 30-70 | 5-30 | 3-15 |
| $H_2$ | vol % | balance | balance | Balance | balance | balance | balance |
| $N_2$ | vol % | 15-20 | 25-35 | 20-40 | 15-20 | | 20-30 |
| $CH_4$ | vol % | | | 1-5 | 2-3 | | |
| $CO_2$ | vol % | | | | | 2.0-2.8 | |
| HCl | vol % | | 1.0-1.5 | | | 2.5-3.5 | 0.5-1.0 |
| $H_2S$ | vol % | | | | | 0.1-1.0 | |
| $TiCl_4$ | vol % | 0.5-2.5 | 1.0-2.0 | 1-3 | 0.5-1.3 | | 0.5-2.5 |
| $CH_3CN$ | vol % | | 0.001-0.03 | | | | |
| $AlCl_3$ | vol % | | | | | 4.0-6.0 | |
| CO | vol % | | | | 1.0-1.5 | | |

Figure 4:
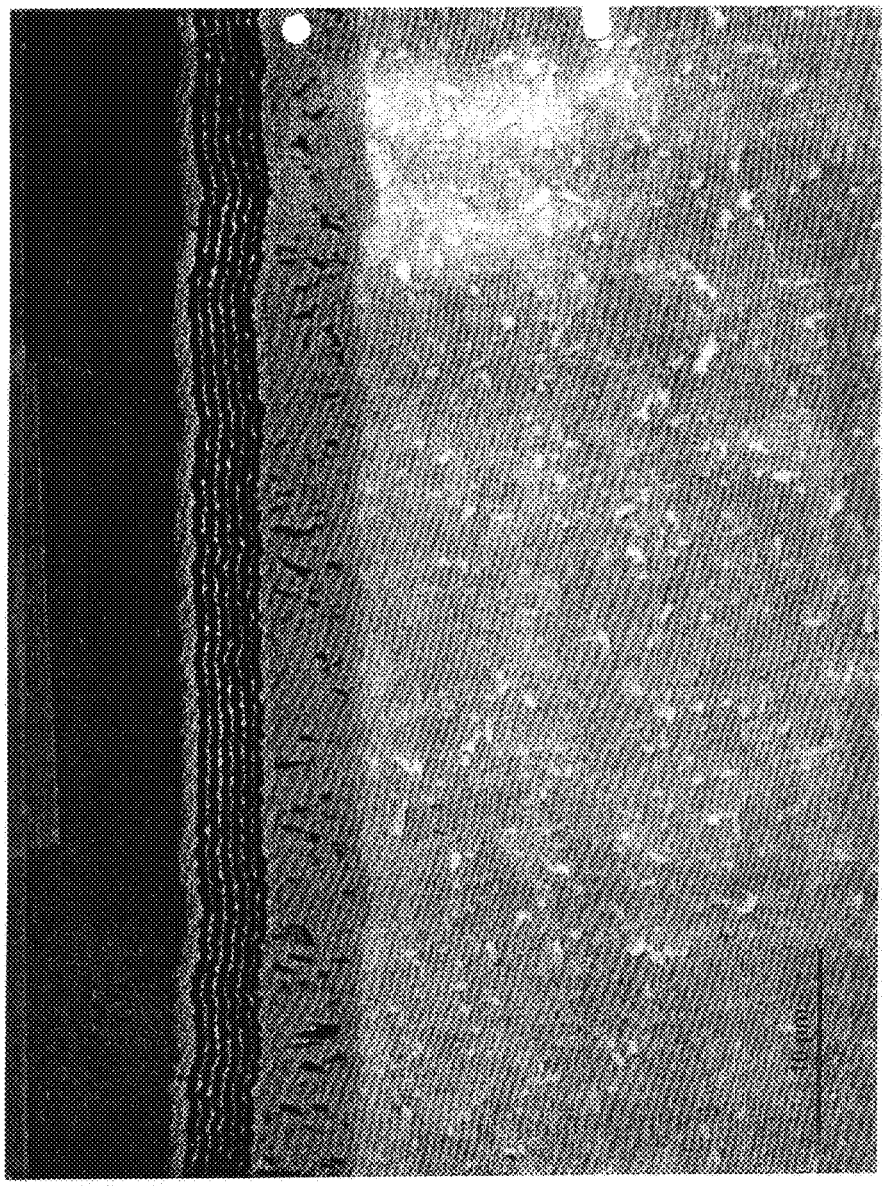
FIG. 4 is photomicrograph (with a scale of 10 μm) of the cross-sectional view of a coated insert showing the distinct layers formed by the plurality of the coating sets deposited atop a backing coating scheme on a cemented carbide substrate.

Referring to the microstructure of the coated cutting insert shown in the photomicrograph FIG. 4, cross-sectional view of a coated insert showing the distinct layers formed by the plurality of the coating sets deposited atop a backing coating scheme on a cemented carbide substrate.

Figure 5:
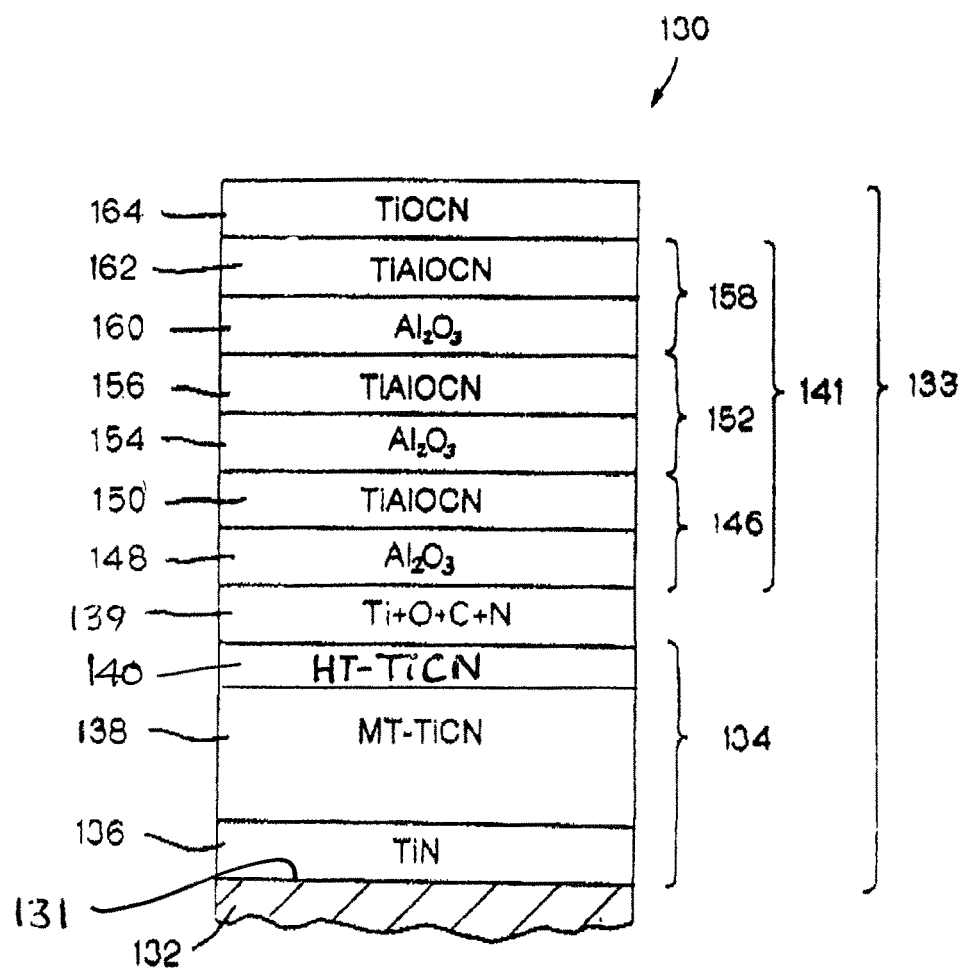
FIG. 5 is a cross-sectional view of a fourth specific embodiment of a coating scheme of a coated cutting insert that shows in schematic form the substrate and the coating layers that comprise the coating scheme.

Referring to the coating scheme shown in FIG. 5, there is a coated cutting insert generally designated as 130 that comprises a substrate 132 and a coating scheme 133 that is on the surface 131 of the substrate 132. Coating scheme 133 comprises a backing coating scheme 134 that comprises a TiN coating layer 136 on the surface of the substrate 132 and a MT-TiCN coating layer 138 on the TiN coating layer 136 and a HT-TiCN coating layer 140 on the MT-TiCN coating layer 138.

There is a Ti+O+C+N transition coating layer 139 containing titanium and oxygen and carbon and nitrogen on the TiCN coating layer 140. It is important to keep in mind that while applicants do not intend to be bound by any specific theory with respect to the function of the Ti+O+C+N transition coating layer, it is thought that the Ti+O+C+N transition coating layer functions to promote the nucleation and adherence of the coating layers of the multi-layered coating scheme.

A multi-layered coating scheme 141 is on the Ti+O+C+N transition coating layer 139 wherein the multi-layered coating scheme 141 comprises a plurality of coating sets (146, 152, 158). Coating set 146 comprises an aluminum oxide coating layer 148 and a TiAlOCN coating layer 150. Coating set 152 comprises an aluminum oxide coating layer 154 and a TiAlOCN coating layer 156. Coating set 158 comprises an aluminum oxide coating layer 160 and a TiAlOCN coating layer 162. In one embodiment of the invention, the outermost repeating layer is exposed. In another embodiment of the invention, there is an optional outer coating layer scheme that can be applied via CVD to the surface of the outermost layer of the repeating set. The specific embodiment of FIG. 5 shows an outer coating layer 164 of TiOCN. Table 5 below sets forth the ranges of the thicknesses of the coating schemes and coating layers for the coated cutting insert 130 illustrated in FIG. 5.

TABLE 5

Thicknesses for Coating Schemes and Coating Layers of FIG. 5

| Coating Layer or Coating Scheme | Range of Thickness (micrometers) | Alternative Range of Thickness (micrometers) |
|---|---|---|
| Coating scheme 133 | 2-35 | 5-30 |
| Backing coating scheme 134 | 1-20 | 2-18 |
| TiN coating layer 136 | up to 2 | up to 1 |
| MT-TiCN coating layer 138 | 1-18 | 2-15 |
| HT-TiCN coating layer 140 | Up to 5 | Up to 2 |
| Ti + O + C + N transition layer | Up to 3 | Up to 2 |
| Multi-layered coating scheme 141 | 1-15 | 2-12 |
| Coating sets 146, 152 and 158 | 0.1-0.8 | 0.2-0.7 |
| Aluminum oxide coating layers 148, 154, 160 | 0.05-0.7 | 0.1-0.5 |
| TiAlOCN coating layers 150, 156, 162 | 0.01-0.5 | 0.05-0.25 |
| Outer TiOCN coating layer 164 | 1.0-3.0 | 1.5-2.5 |

Table 6 below sets forth the deposition parameters for the deposition of the coating scheme 133 of the coated cutting insert 130 of FIG. 5.

TABLE 6

Process to Produce the Coating Scheme of FIG. 5

| | | Backing | Backing | Backing | Transition | Repeat sequence for the Multi-Layered Coating Scheme | | Outer |
|---|---|---|---|---|---|---|---|---|
| | | TiN | MT-TiCN | HT-TiCN | Ti + O + C + N | $Al_2O_3$ | TiAlOCN | TiOCN |
| Temp Range | (° C.) | 850-960 | 750-900 | 970-1000 | 950-1020 | 920-1020 | 970-1000 | 970-1000 |
| Press Range | (mb) | 60-90 | 40-90 | 120-380 | 100-400 | 50-120 | 60-200 | 60-400 |
| Duration | Minutes | 10-90 | 50-400 | | 30-70 | 5-30 | | |
| $H_2$ | vol % | balance | balance | balance | balance | balance | balance | balance |
| $N_2$ | vol % | 15-20 | 25-35 | 15-45 | 15-20 | | 5-20. | 35-45 |
| $CH_4$ | vol % | | | 1-4.5 | 2-3 | | 0-3 | 2.5-3.5 |
| $CO_2$ | vol % | | | | | 2.0-2.8 | | |
| HCl | vol % | | 1.0-2.0 | | | 2.5-3.5 | 0-3 | 1-1.5 |
| $H_2S$ | vol % | | | | | 0.1-1.0 | | |
| $TiCl_4$ | vol % | 0.5-2.5 | 1.0-2.0 | 0.8-3 | 0.5-1.3 | | 0.1-2.5 | 1.8-2.4 |
| $CH_3CN$ | vol % | | 0.001-0.03 | | | | | |
| $AlCl_3$ | vol % | | | | | 4.0-6.0 | 2-4. | |
| CO | vol % | | | 1-2 | 1.0-1.5 | | 1-5.5 | 1-1.5 |

Cutting tests were conducted to evaluate the performance of the coated cutting inserts of the invention as compared to standard conventional coated cutting inserts. Tables 7 and 8 sets forth test results as measured in number of passes using the following wear criteria: The tests were conducted under the following parameters: cutting insert geometry CNMG432RN (straight cutting edge style); lead angle 0°/90°; cutter diameter=2.48 inches; maximum tool diameter=2.48 inches; length of pass=12 inches; MMR=1.95 inches$^3$/minute; cutting speed=820 surface feet per minute; revolutions per minute=1263; program chip load (fz)=0.008 ipt; feed rate (Vf)=10.104 ipm; axial depth of cut (Ap) =0.098 inch; radial depth of cut (Ae)=1.969 inch; machine=Mazak AJV; coolant=dry; and work material DCI 80-55-06.

TABLE 7

Test Results for Coated Cutting Inserts

| Sample | Rep. 1 | Rep. 2 | Standard Deviation | Average | % Improvement |
|---|---|---|---|---|---|
| Control-Standard Coated Cutting Inserts | 12.00 | 15.00 | 2.12 | 13.50 | — |
| Coated Cutting Insert of FIG. 2 with 4 coating sets of Al2O3/TiOCN | 19.00 | 24.00 | 3.54 | 21.50 | 59% |
| Coated Cutting Insert of FIG. 2 with 8 coating sets of Al2O3/TiOCN | 15.00 | 19.00 | 2.83 | 17.00 | 26% |

TABLE 8

Test Results for Coated Cutting Inserts

| Sample | Rep. 1 | Rep. 2 | Standard Deviation | Average | % Improvement |
|---|---|---|---|---|---|
| Control-Standard Coated Cutting Inserts | 9.80 | 14.30 | 3.18 | 12.05 | — |
| Coated Cutting Insert of FIG. 2 with 4 coating sets of Al2O3/TiOCN | 18.50 | 21.50 | 2.12 | 20.00 | 66% |
| Coated Cutting Insert of FIG. 2 with 8 coating sets of Al2O3/TiOCN | 14.60 | 18.80 | 2.97 | 16.70 | 38% |

A key characteristic in the failure mode of a coating structure described in this invention is the wear mechanism exhibited during a heavily interrupted chip forming process.

In interrupted cutting operations, the coating experiences an impact every time it engages with the workpiece material. Successive impacts can result in fatigue failure of the coating resulting in flaking through one or more layers in conventional coatings. In the inventive coating described herein, failure of a single coating layer unit does not compromise the integrity of the entire coating scheme because a crack is dissipated between coating layer units (e.g., pair of coating layers comprising $Al_2O_3$—Ti-containing layer). In other words, the present inventive coating scheme limits the extent of damage to a specific single coating layer step (or $Al_2O_3$—Ti-containing coating layer pair) thereby preventing the propagation of a crack(s) throughout the entire coating scheme. The failure of a single coating layer step (or $Al_2O_3$—Ti-containing coating layer pair) does not compromise the integrity of the overall coating scheme including the underlying $Al_2O_3$—Ti-containing coating layer pairs. This feature is shown in FIGS. 6A through 6C.

Figure 6A:
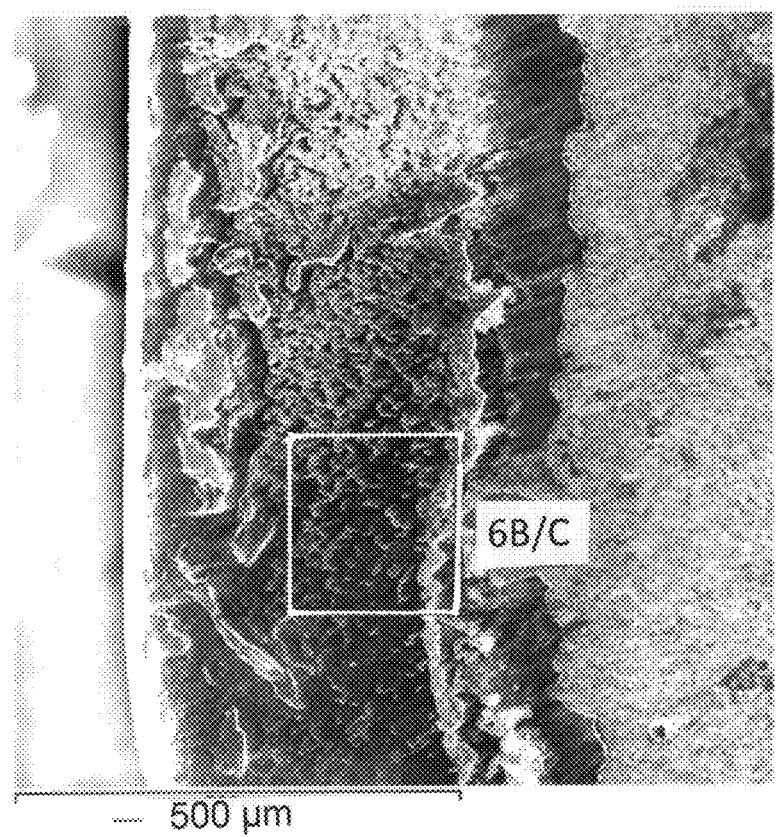
FIG. 6A is a photomicrograph (with a scale of 500 μm) of a cross-section of a worn inventive coated cutting insert wherein an area on the photomicrograph is designated as "6B/C"
Figure 6B:
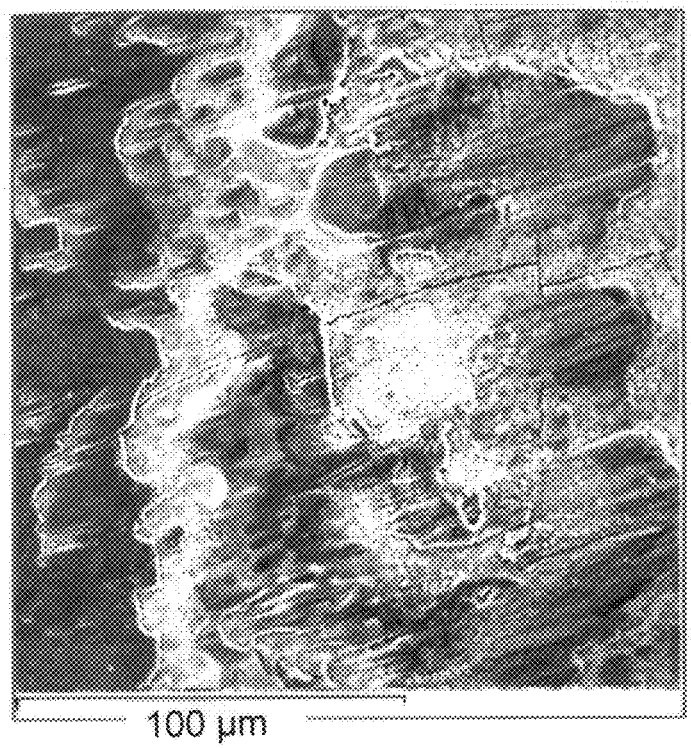
FIG. 6B is a photomicrograph (with a scale of 100 μm) of the area of FIG. 6A designated as 6B/C.
Figure 6C:
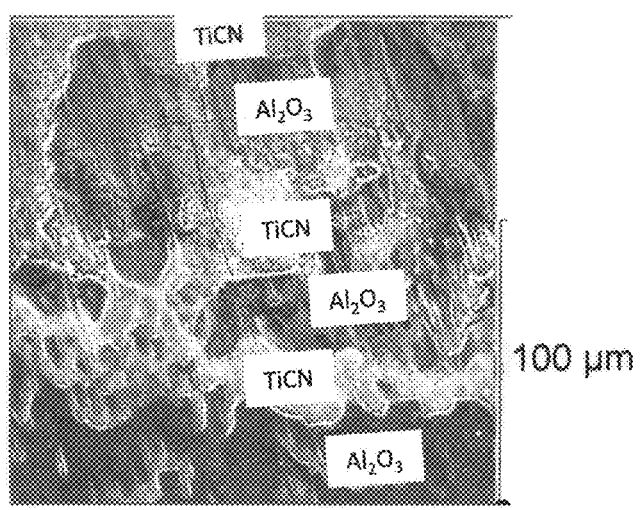
FIG. 6C is a photomicrograph (with a scale of 100 μm) of the area of FIG. 6A designated as 6B/C, but rotated relative to FIG. 6B and containing labels for coating layers.

The coating scheme of FIGS. 6A-6C comprises a TiN base coating layer on the surface of a substrate, a MT-TiCN coating layer on the TiN base coating layer, a HT-TiCN coating layer on the MT-TiCN coating layer, and on the HT-TiCN coating a repeating series of Ti-containing coating layer-$Al_2O_3$ coating layer pairs wherein the Ti-containing coating layer is HT-TiCN. An outermost HT-TiCN coating layer is on top of the outermost $Al_2O_3$ coating layer of the repeating series, and a TiN coating layer is on top of the outermost HT-TiCN coating layer. FIG. 6A is a photomicrograph that shows in cross-section some of the coating layers of an inventive coating scheme. FIG. 6A contains an area designated as 6B/C, which is the area shown by the photomicrographs FIG. 6B and FIG. 6C. FIG. 6B and FIG. 6C is the same photomicrograph, except that FIG. 6C is rotated relative to FIG. 6B and FIG. 6C contains labels that identify the coating layers. As described above, the feature of a crack being dissipated between coating layer units (e.g., pair of coating layers comprising $Al_2O_3$—Ti-containing layer) is shown in FIGS. 6A through 6C, and especially in FIG. 6B and FIG. 6C.

Figure 7A:
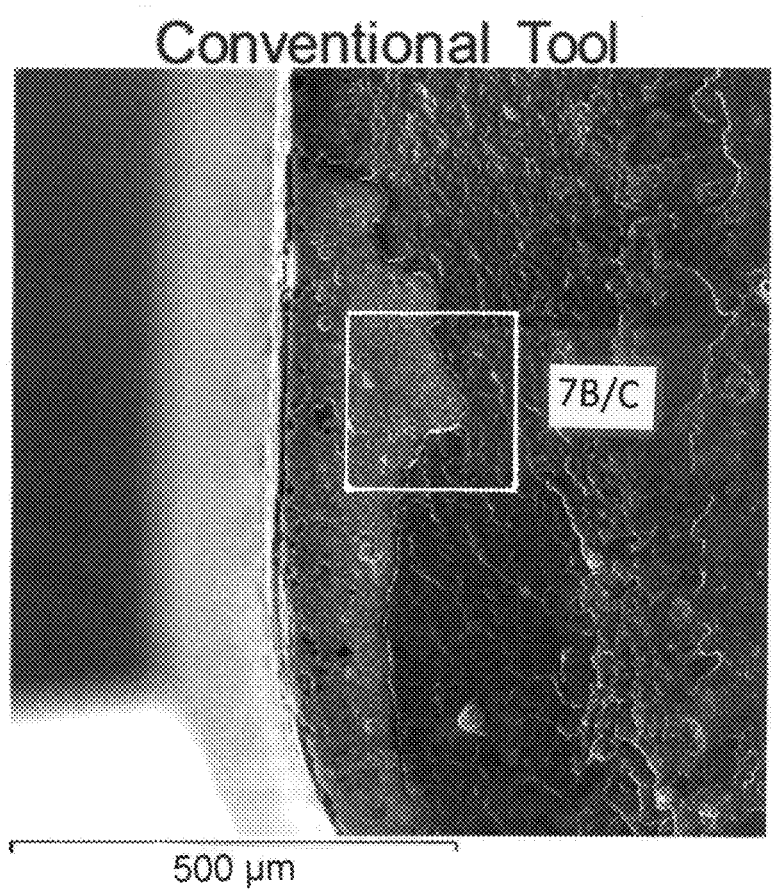
FIG. 7A is a photomicrograph (with a scale of 500 μm) of a cross-section of a worn conventional coated cutting insert wherein an area on the photomicrograph is designated as "7B/C"
Figure 7B:
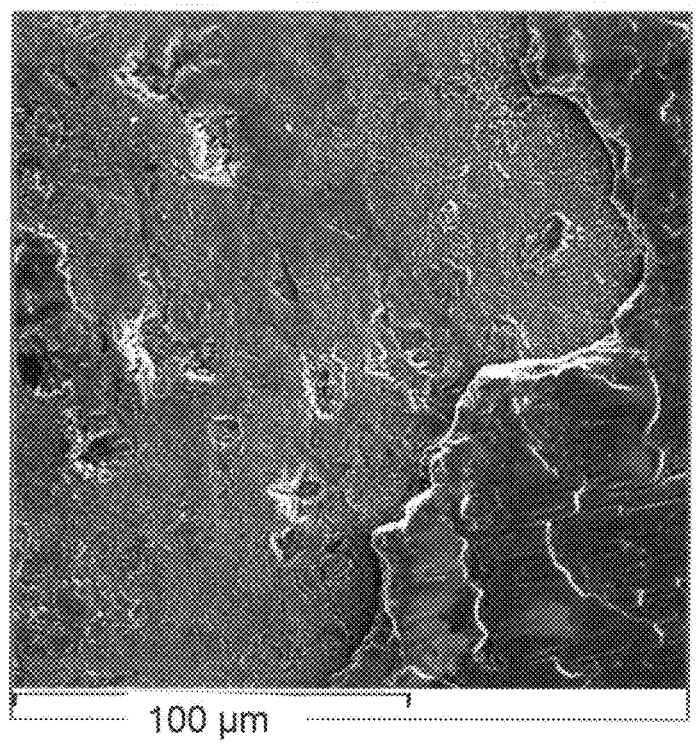
FIG. 7B is a photomicrograph (with a scale of 100 μm) of the area of FIG. 7A designated as 7B/C.
Figure 7C:
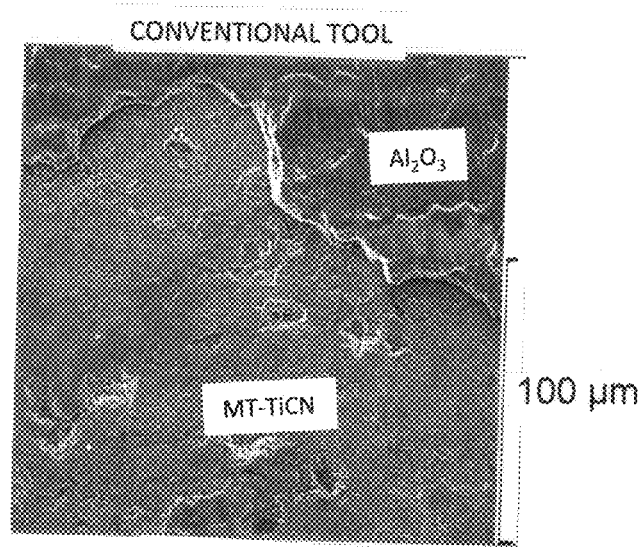
FIG. 7C is a photomicrograph (with a scale of 100 μm) of the area of FIG. 7A designated as 7B/C, but rotated relative to FIG. 7B and containing labels for coating layers.

The conventional coating scheme of a conventional tool is shown in FIGS. 7A through 7C. The conventional coating scheme of FIGS. 7A through 7C comprises a TiN base coating layer on the surface of a substrate, a MT-TiCN coating layer of the TiN base coating layer, a TiCN coating layer on the MT-TiCN coating layer, a Ti-containing coating layer on the TiCN coating layer, a single $Al_2O_3$ coating layer on the Ti-containing coating layer. An outermost TiCN coating layer is on top of the $Al_2O_3$ coating layer, and a TiN coating layer is on top of the outermost TiCN coating layer. FIG. 7A is a photomicrograph that shows in cross-section some of the coating layers of a conventional coating scheme. FIG. 7A contains an area designated as 7B/C, which is the area shown by the photomicrographs FIG. 7B and FIG. 7C. FIG. 7B and FIG. 7C is the same photomicrograph, except that FIG. 7C is rotated relative to FIG. 7B and FIG. 7C contains labels that identify the coating layers. As shown by FIGS. 7A-7C, the conventional coating scheme exhibits a complete failure due to cracking thereby exposing the underlying coating structure so as to render the cutting tool susceptible to increased wear, which can result in a shorter useful tool life.

The substrate for each one of the specific embodiments can be selected from the same group of materials. In this regard, suitable materials for the substrate include cemented carbides (e.g., tungsten carbide-cobalt materials). Another preferred substrate material is based on cobalt cemented tungsten carbide that comprises between about 0.1 weight percent and about 20 weight percent cobalt and the balance tungsten carbide. It is possible that such a cobalt cemented tungsten carbide may include additives like titanium, tantalum, niobium, zirconium, hafnium, vanadium, and chromium either alone or in any combination wherein these additives may be in the form of carbides and/or nitrides and/or carbonitrides, as well as other additives typically added to cemented carbides. In still another composition, the substrate comprises a cemented tungsten carbide comprising: between about 89.8 weight percent and about 92.3 weight percent tungsten carbide, between about 5.7 weight percent and about 11.5 weight percent cobalt, up to about 3.0 weight percent tantalum, up to about 2 weight percent titanium, up to about 2.4 weight percent niobium, and up to about 0.80 weight percent chromium.

Applicants also contemplate that the substrate could exhibit gradient compositions, especially in the binder concentration, the carbonitride concentration and the carbide concentration. Exemplary substrates could include a cemented carbide substrate that presents a surface zone of binder enrichment or a cemented carbide substrate that exhibits a surface zone of binder depletion of solid solution carbide enrichment.

For each one of the specific embodiments, it should be appreciated that prior to the deposition of the coating scheme the surface of the substrate may be treated so as to improve the adhesion of the coating scheme to the substrate. Exemplary pre-treatments include a process to remove or reduce the level of binder at the surface of the substrate. In the case of the cobalt cemented tungsten carbide substrate such a pre-treatment would remove cobalt from the surface of the substrate or treat the surface to improve the coating adhesion. Another exemplary pre-treatment would be a process that mechanically works the surface of the substrate so as to roughen the surface of the substrate making it ready to produce good coating adhesion.

It should be appreciated that in some instances the surface of the coating scheme may be subjected to a post-deposition treatment so as to improve performance by smoothening and producing a stress altering effect on the coating. One exemplary treatment is the removal of asperities from the surface of the coating scheme so as to reduce or minimize any stress riser sites. Another exemplary treatment is to preferentially remove the coating (or a part of the coating layer) from selected areas of the cutting insert. A surface treatment typically reduces the tensile stresses or increases the compressive stresses in the coating layer(s). For example, PCT Patent Publication No. WO 02/077312 to Widia GmbH discloses shot blasting a coating (PVD or PCVD or CVD) to increase internal pressure stress or reduce internal tension stress in the outer coating layers.

Furthermore, it should be appreciated that to improve adhesion of the coating layers there may be provided microscopically rough interfaces between each of the coating layers. These microscopically rough interfaces can be generated by controlling the CVD (or moderate temperature chemical vapor deposition [MT-CVD]) parameters so as to promote high growth rates for the coating layers. High growth rates in CVD (including MT-CVD processes) processes may occur by the use of relatively high deposition temperatures and/or relatively high pressures. As another alternative to improve adhesion between coating layers, in the deposition process the composition can be gradually changed between adjacent layers so as to reduce the existence of a sharp compositional interface between adjacent coating layers.

In view of the above, it can be appreciated that there is provided an improved coated cutting insert, and a method of making the same, wherein the cutting insert is useful in material removal applications wherein the coated cutting insert has a coating scheme with a high toughness resulting in better edge integrity, especially during heavily interrupted turning and milling operations. There is provided an improved coated cutting insert, and a method of making the same, wherein the cutting insert is useful in material removal applications wherein the coated cutting insert has a coating scheme which includes a multi-layered coating scheme that better inhibits crack growth and propagation in the coating scheme whether due to mechanical stresses or thermal cycling. There is provided an improved coated cutting insert, and a method of making the same, wherein the cutting insert is useful in material removal applications wherein the coated cutting insert has a coating that includes a transition coating layer that functions to promote better nucleation and adhesion of the multi-layered coating scheme.

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A coated cutting insert for chipforming material removal operation, the coated cutting insert comprising:
   a substrate and a coating scheme on the substrate;
   the coating scheme comprises:
   a backing coating scheme deposited by chemical vapor deposition, and the backing coating scheme being on the surface of the substrate and comprising an innermost titanium nitride coating layer and a mediate MT-titanium carbonitride coating layer having a thickness between about 1 µm and about 18 µm and an outermost coating layer comprising either a titanium nitride coating layer or a HT-titanium carbonitride coating layer;
   a transition coating layer deposited by chemical vapor deposition, the transition coating layer being on the surface of the backing coating scheme; and
   a multi-layered coating scheme deposited by chemical vapor deposition comprising a plurality of coating sets, the multi-layered coating scheme being on the surface of the transition coating layer; and
   each of the coating sets comprising an aluminum oxide coating layer having an alpha aluminum oxide crystal structure and a nitrogen-containing coating layer of titanium oxycarbonitride and having a nitrogen-containing coating layer crystal structure, the aluminum oxide crystal structure being distinct from the nitrogen-containing coating layer crystal structure whereby a distinct boundary is between adjacent ones of the aluminum oxide coating layer and the nitrogen-containing coating layer, wherein the titanium oxycarbonitride layer contacts the aluminum oxide coating layer of an adjacent coating set.

2. The coated cutting insert according to claim 1 wherein for each one of the coating sets, the aluminum oxide coating layer having a thickness between about 0.05 µm and about 0.7 µm, and the nitrogen-containing coating layer having a thickness between about 0.01 µm and about 0.5 µm.

3. The coated cutting insert according to claim 1 wherein the multi-layer coating scheme having a thickness between about 1 µm and about 15 µm.

4. The coated cutting insert according to claim 1 wherein the outermost coating layer comprising the HT-titanium carbonitride coating layer.

5. The coated cutting insert according to claim 1 wherein for each of the coating sets, the aluminum oxide coating layer being closer to the substrate than the nitrogen-containing coating layer.

6. The coated cutting insert according to claim 1 wherein the substrate comprising a cemented tungsten carbide comprising: between about 89.8 weight percent and about 92.3 weight percent tungsten carbide, between about 5.7 weight percent and about 11.5 weight percent cobalt, up to about 3.0 weight percent tantalum, up to about 2 weight percent titanium, up to about 2.4 weight percent niobium, and up to about 0.80 weight percent chromium.

7. The coated cutting insert according to claim 1 wherein the coating scheme further comprising an outer coating scheme on the multi-layered coating scheme.

8. The coated cutting insert according to claim 7 wherein the outer coating scheme comprising a titanium oxycarbonitride coating layer.

9. The coated cutting insert according to claim 1 wherein the transition coating layer comprises titanium, oxygen, carbon and nitrogen.

10. The coated cutting insert of claim 1 comprising 2 to 16 coating sets.

11. The coated cutting insert of claim 1, wherein the coating sets have an individual thickness of 0.95-1.2 µm.

12. A coated cutting insert for chipforming material removal operation, the coated cutting insert comprising:
    a substrate and a coating scheme on the substrate;
    the coating scheme comprises:
    a backing coating scheme deposited by chemical vapor deposition, and the backing coating scheme being on the surface of the substrate and comprising an innermost titanium nitride coating layer and a mediate MT-titanium carbonitride coating layer having a thickness between about 1 µm and about 18 µm and an outermost coating layer comprising either a titanium nitride coating layer or a HT-titanium carbonitride coating layer;
    a transition coating layer deposited by chemical vapor deposition, the transition coating layer being on the surface of the backing coating scheme; and
    a multi-layered coating scheme deposited by chemical vapor deposition comprising a plurality of coating sets, the multi-layered coating scheme being on the surface of the transition coating layer; and
    each of the coating sets comprising an aluminum oxide coating layer having an alpha aluminum oxide hexagonal crystal structure and a nitrogen-containing coating layer of titanium oxycarbonitride having a nitrogen-containing coating layer cubic crystal structure, whereby a distinct boundary is between adjacent ones of the aluminum oxide coating layer and the nitrogen-containing coating layer, wherein the titanium oxycarbonitride layer contacts the aluminum oxide coating layer of an adjacent coating set.

13. The coated cutting insert according to claim 12 wherein for each one of the coating sets, the aluminum oxide coating layer having a thickness between about 0.05 µm and about 0.7 µm, and the nitrogen-containing coating layer having a thickness between about 0.01 µm and about 0.5 µm.

14. The coated cutting insert of claim 12 comprising 2 to 16 coating sets.

15. The coated cutting insert of claim 12, wherein the coating sets have an individual thickness of 0.95-1.2 μm.

16. A coated cutting insert for chipforming material removal operation, the coated cutting insert comprising:
a substrate and a coating scheme on the substrate;
the coating scheme comprises:
a backing coating scheme deposited by chemical vapor deposition, and the backing coating scheme being on the surface of the substrate and comprising an innermost titanium nitride coating layer and a mediate MT-titanium carbonitride coating layer having a thickness between about 1 μm and about 18 μm and an outermost coating layer comprising either a titanium nitride coating layer or a HT-titanium carbonitride coating layer; and
a multi-layered coating scheme deposited by chemical vapor deposition comprising a plurality of coating sets, the coating sets comprising an aluminum oxide coating layer having an alpha aluminum oxide hexagonal crystal structure and a nitrogen-containing coating layer of titanium oxycarbonitride having cubic crystal structure, whereby a distinct boundary is between adjacent ones of the aluminum oxide coating layer and the nitrogen-containing coating layer, wherein the titanium oxycarbonitride layer contacts the aluminum oxide coating layer of an adjacent coating set and titanium oxycarbonitride layers are innermost and outer layers of the multilayered coating scheme.

* * * * *